United States Patent
Cheng et al.

(10) Patent No.: US 7,687,784 B2
(45) Date of Patent: Mar. 30, 2010

(54) METHOD AND DEVICE OF ION SOURCE GENERATION

(75) Inventors: Nai-Yuan Cheng, Taipei (TW); Yun-Ju Yang, Taichung (TW); Cheng-Hui Shen, Hsinchu County (TW); Junhua Hong, San Jose, CA (US); Jiong Chen, San Jose, CA (US); Tienyu Sheng, Saratoga, CA (US); Linuan Chen, San Jose, CA (US)

(73) Assignees: Advanced Ion Beam Technology, Inc., Hsinchu (TW); Advanced Ion Beam Technology, Inc., San Jose, CA (US)

( * ) Notice: Subject to any disclaimer, the term of this patent is extended or adjusted under 35 U.S.C. 154(b) by 116 days.

(21) Appl. No.: 12/126,312

(22) Filed: May 23, 2008

(65) Prior Publication Data
US 2009/0194704 A1 Aug. 6, 2009

(30) Foreign Application Priority Data
Feb. 5, 2008 (TW) .............................. 97104687 A

(51) Int. Cl.
H01J 7/24 (2006.01)
H01J 27/02 (2006.01)
H01J 49/10 (2006.01)

(52) U.S. Cl. .................... 250/423 R; 250/424; 250/427; 250/492.21; 315/111.81; 315/111.91

(58) Field of Classification Search ............. 250/423 R, 250/424, 427, 492.21; 315/111.81, 111.91
See application file for complete search history.

(56) References Cited

U.S. PATENT DOCUMENTS

| | | | |
|---|---|---|---|
| 7,064,491 B2 * | 6/2006 | Horsky et al. | 315/111.81 |
| 7,609,003 B2 * | 10/2009 | Horsky et al. | 315/111.81 |
| 2008/0067412 A1 * | 3/2008 | Vanderberg et al. | 250/427 |

* cited by examiner

*Primary Examiner*—Nikita Wells
(74) *Attorney, Agent, or Firm*—Muncy, Geissler, Olds & Lowe, PLLC

(57) ABSTRACT

An implanter is equipped with an ion beam current detector, a temperature sensor, a temperature controller and a cooling system to increase the ratio of a specific ion cluster in the ion source chamber of the implanter. Therefore, the implanting efficiency for a shallow ion implantation is increased consequently.

16 Claims, 5 Drawing Sheets

METHOD AND DEVICE OF ION SOURCE GENERATION

BACKGROUND OF THE INVENTION

1. Field of Invention

This invention relates to a method and device of ion source generation and, in particular, the method and device can enhance the implanting efficiency of a shallow ion implantation.

2. Background of the Related Art

As shown in FIG. 1, an ion implanter uses a filament 100 to ionize the atoms and/or atom clusters to form ions and/or ion clusters in source chamber 200. An electric field accelerates the ions/ion clusters to form an ion beam 610 and, after passing a mass spectrometer 400, the ions/ion clusters of the ion beam 610 are filtered to have a specific charge-mass ratio. And, then the ion beam 610 injects into the implantation chamber 500 after passing the channel 300.

A target base 510 and a Faraday cup 600 are configured in the implantation chamber 500, and a wafer 520 is settled on the target base 510. The ion beam 610 collides with the wafer 520 with a specific collision depth, which proportionally depends on the kinetic energy of the ions/ion cluster of the ion beam 610. The implanting efficiency proportionally depends on the current of the ion beam 610, and an ion beam current detector 700, which electrically couples with the Faraday cup 600, can detect the current. The current detector 700 can be implemented by an ampere meter.

An ion cluster will distribute averagely the energy to each ion of the ion cluster, so the ion implanting energy should be reduced to be suitable for a shallow ion implantation.

FIG. 2 shows the curves of the temperature T and the ion beam current I, which vary with time t, where T is the shell temperature of the source chamber 200 and I is the current of ion beam 610 detected by the ion beam current detector 700. As shown in FIG. 2, from t=0, the time of lighting up the filament 100, to t=$t_1$, ion beam current I increases and approaches to the maximum. In the meanwhile, temperature T increases and approaches a minimum threshold temperature $T_m$. T increases continuously with time, till time t=$t_2$, and the ion beam current I surpasses the maximum ion beam current value and begins to decrease to a minimum threshold ion beam current $I_m$ and keep decreasing to be less than $I_m$.

It is very important to keep a high ratio ion cluster for obtaining a high ion beam current, and a skill is proposed in this invention.

SUMMARY OF THE INVENTION

It is an object of this invention to provide a method and a device of ion source generation. The method uses a temperature controller to read an ion beam current detected by an ion beam current detector and a temperature of the source chamber sensed by a thermometer to adjust a cooling system for controlling the source chamber temperature, so a specific ratio of ion cluster in the source chamber can be obtained.

DETAILED DESCRIPTION OF THE INVENTION

Figure 1:
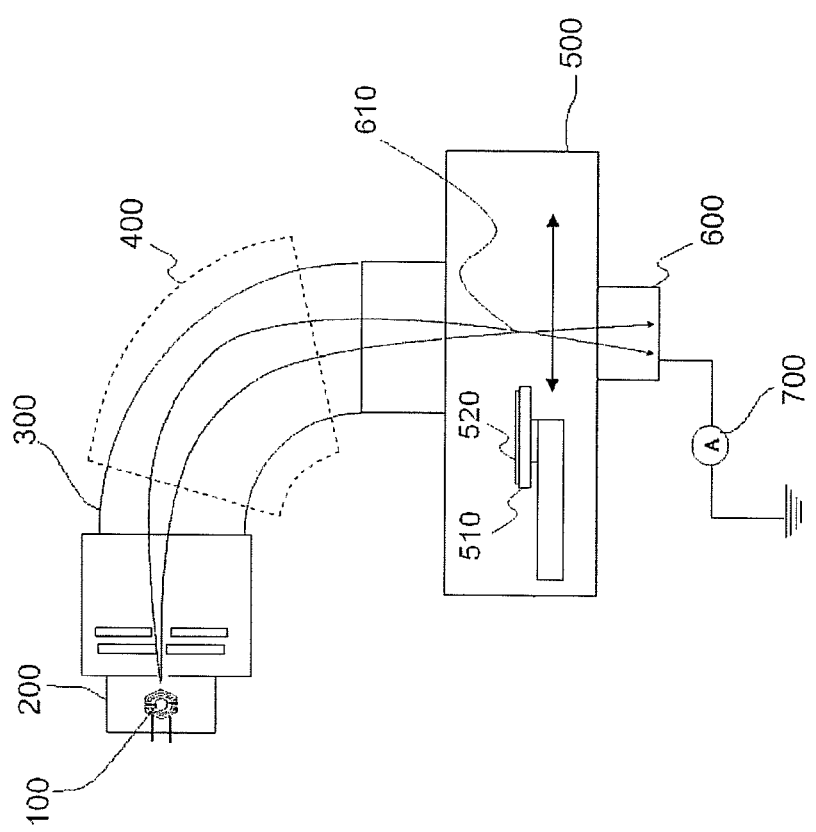
FIG. 1 shows an ion implanter according to a prior art.
Figure 2:
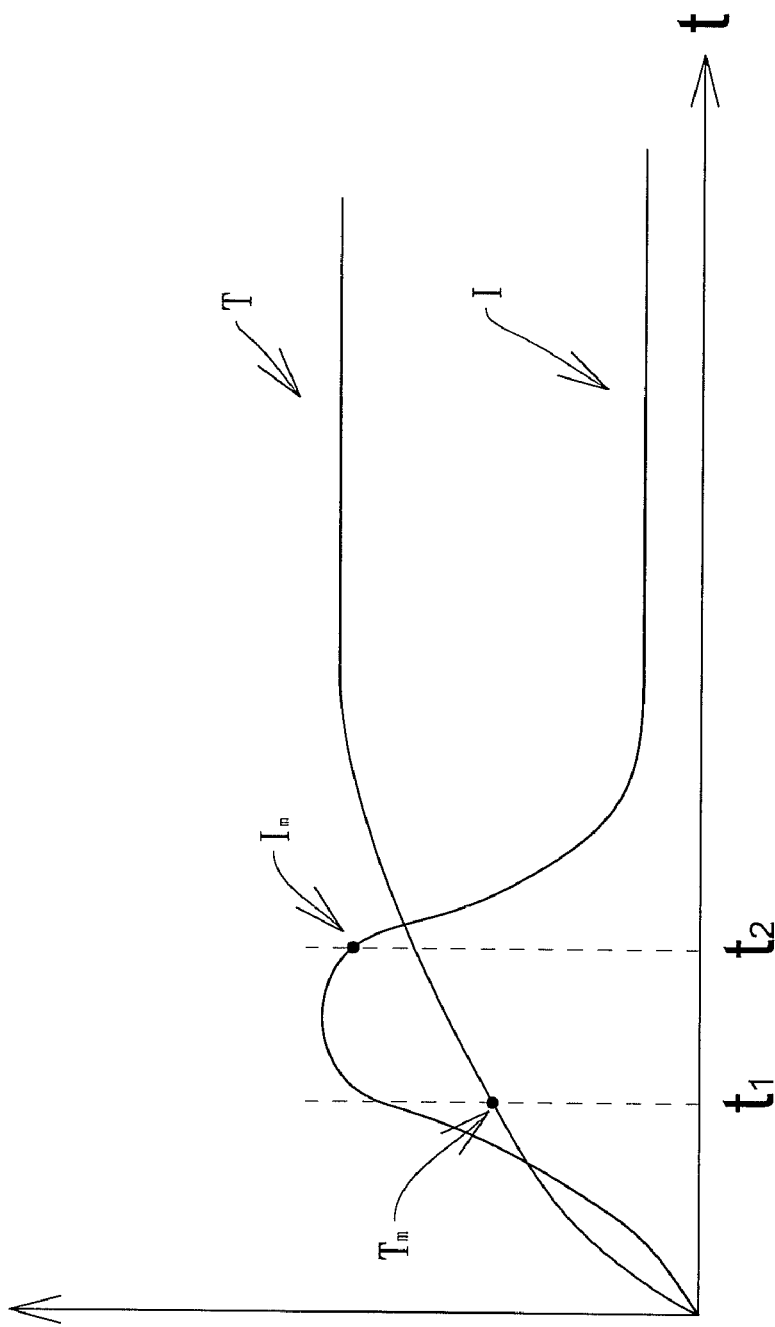
FIG. 2 shows the relationship of the ion beam current and the temperature with time according to a prior art.
Figure 3:
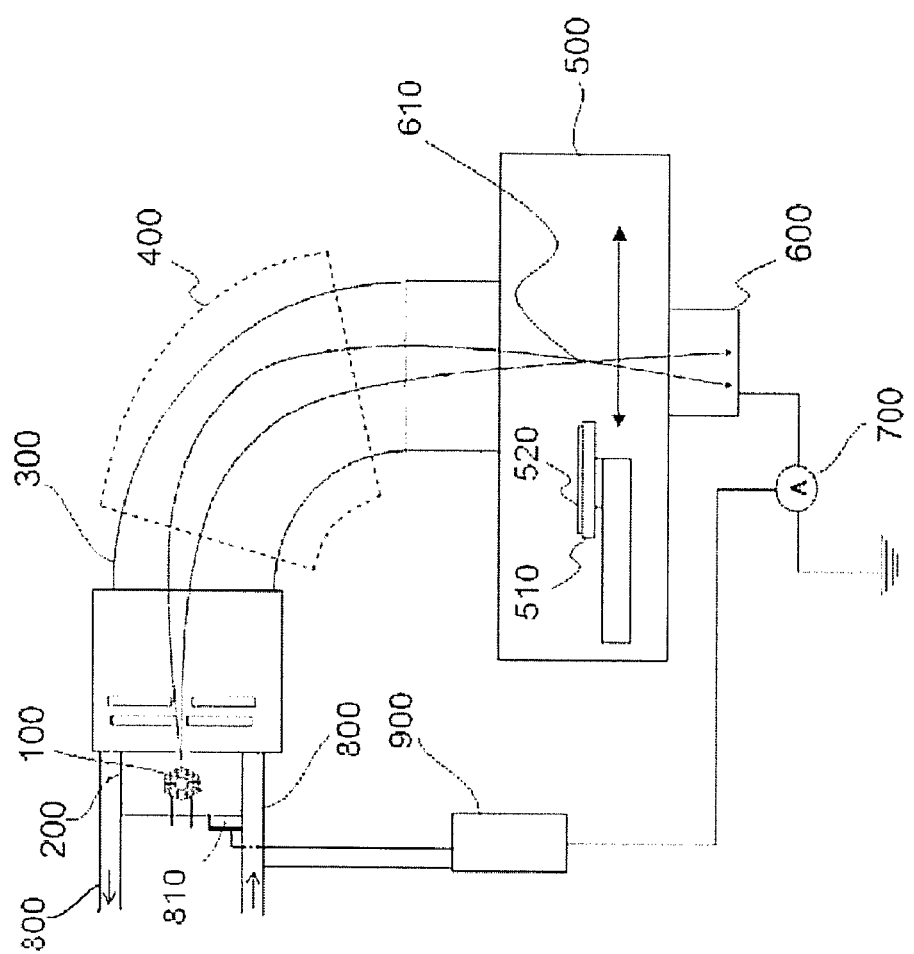
FIG. 3 shows an ion implanter according to an embodiment of this invention.

FIG. 3 shows an ion implanter, which is the combination of an ion implanter shown in FIG. 1 and an ion source generation device, according to an embodiment of this invention. The device of an ion source generation further includes a cooling system 800, a temperature sensor 810 and a temperature controller 900, where the cooling system 800 may operate on circulating coolant fluid or water.

The cooling system 800 and the temperature sensor 810 are disposed on the shell of the source chamber 200 to sense the temperature of the source chamber 200, and to control the temperature of the source chamber 200 efficiently, respectively.

The temperature controller 900 electrically connects to the temperature sensor 810 and an ion beam current detector 700, such as an ampere meter, to obtain the temperature of the source chamber 200 and the current of the ion beam 610. According to the relationship of the temperature and the ion beam current, the temperature controller 900 adjusts the fluid flow rate of the cooling system 800 to control the temperature of the source chamber 200 to be within a range. Therefore the ion beam current I can be controlled to stay above a minimum threshold ion beam current $I_m$, where the minimum threshold ion beam current $I_m$ may be predetermined or a current value within a range from 90% to 95% of the maximum ion beam current.

Figure 4:
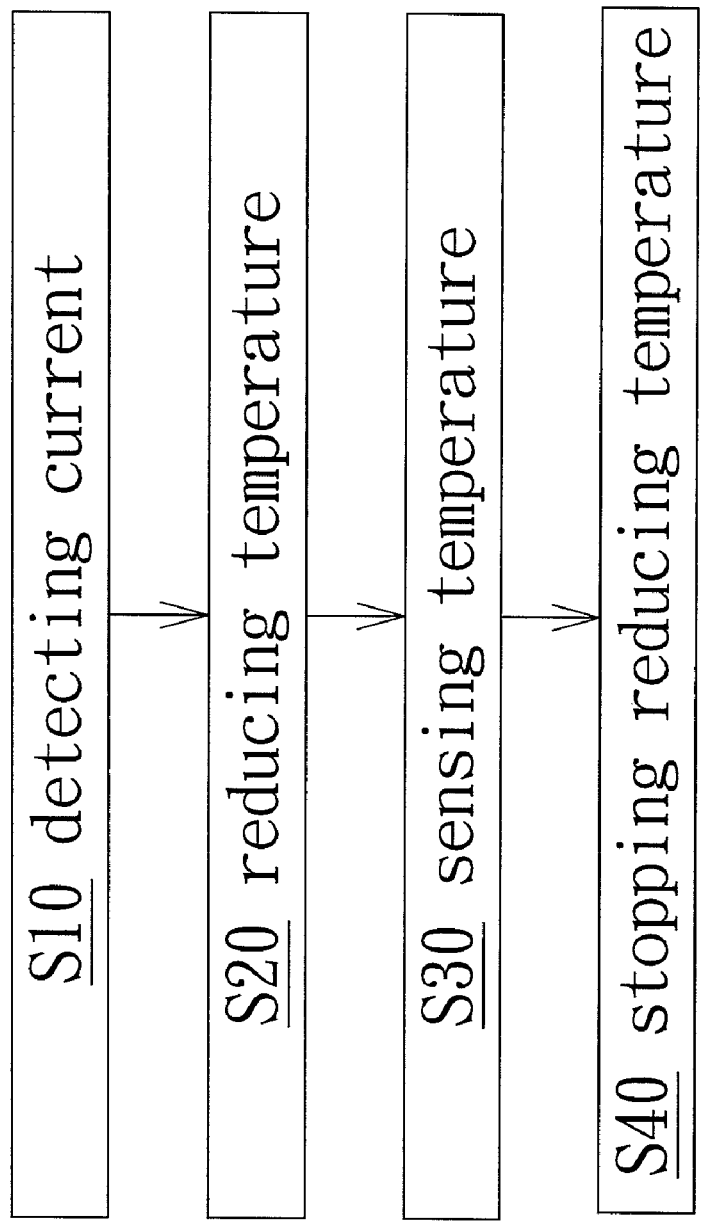
FIG. 4 show the flow chart of controlling ion beam current according to an embodiment of this invention.

According to an embodiment of this invention, a method of controlling the ion source generation is illustrated and the flow chart is shown in FIG. 4. Accompanying FIG. 5, which shows the relationship of the temperature T of the source chamber 200 and current I of the Faraday cup with time t. The method is illustrated as follows.

Figure 5:
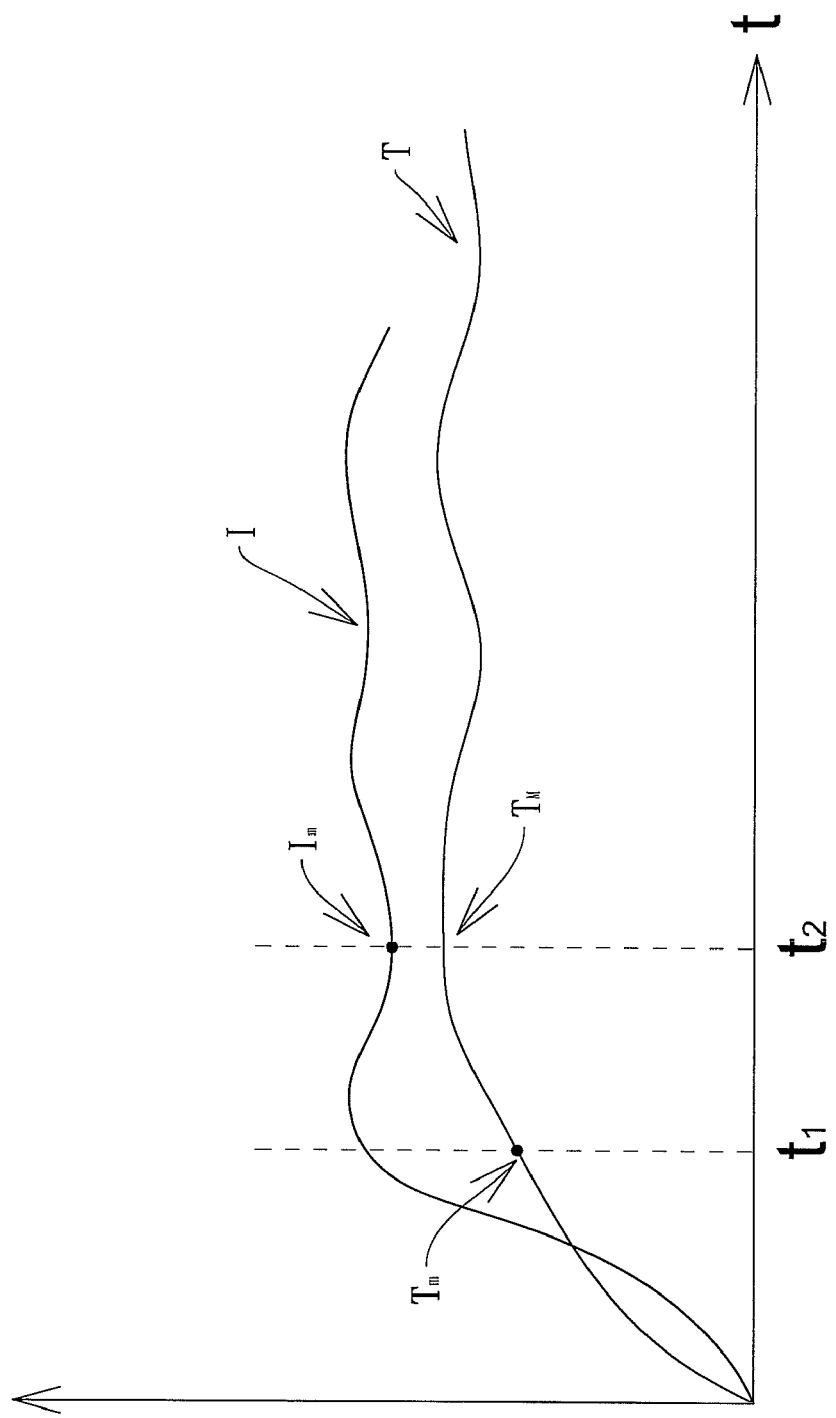
FIG. 5 shows the relationship of the ion beam current and the temperature with time according to an embodiment of this invention.

During the period of heating the source chamber 200 (increasing the temperature T), the ion beam current detector 700 detects the current of the Faraday cup and the temperature controller 900 reads the detected ion beam current and compares it with the minimum threshold ion beam current $I_m$ (step S10). According to the comparison results, when the temperature controller 900 determines that the current I has come to or fallen below $I_m$ and, in the meanwhile, the temperature T has gone to or risen up above a maximum threshold temperature $T_M$ (as shown in FIG. 5), the temperature controller 900 starts up the cooling system 800 or increases the fluid flow rate of the cooling system 800 to reduce the temperature T (step S20). The step S20 can avoid break of the ion cluster caused by the increasing temperature. The minimum threshold ion beam current $I_m$ can be predetermined or set to a current value within 90% to 95% of the maximum ion beam current.

During the period of cooling the source chamber 200 (reducing the temperature T), the temperature controller 900 continuously reads temperature T sensed by the temperature sensor 810, denoted as step S30, and compares the temperature T with a minimum threshold temperature $T_m$ (as shown in FIG. 5). According to the comparison results, when the temperature controller 900 determines that the temperature T has come to or fallen below the minimum threshold temperature $T_m$, the temperature controller 900 shuts down the cooling system 800 or reduces the fluid flow rate of the cooling system 800 to ensure the formation of the specific ion cluster (step S40). The minimum threshold temperature $T_m$ may be predetermined or set to a temperature value, which holds the ion beam current between 90% to 95% of the maximum ion beam current.

According to the above, the temperature T of the source chamber 200 can be controlled in a range from the minimum threshold temperature $T_m$ to the maximum threshold temperature $T_M$, denoted $T_m \leq T \leq T_M$. Within this temperature range, the current can be hold above the minimum threshold ion beam current $I_m$ and approaches the maximum, so the method can improve the ion implanting efficiency of a shallow ion implantation.

Although this invention has been explained in relation to its preferred embodiment, it is to be understood that modifications and variation can be made without departing the spirit and scope of the invention as claimed.

What is claimed is:

1. A method of ion source generation, applied to an ion implanter, comprising:
    detecting the ion beam current of said ion implanter;
    sensing the temperature of a source chamber of said ion implanter; and
    controlling the temperature of said source chamber to hold the ion beam current above a minimum threshold ion beam current according to the detected ion beam current and the sensed temperature.

2. A method according to claim 1, wherein the step of controlling the temperature of said source chamber is to compare the detected ion beam current with a minimum threshold ion beam current, and then to cool said source chamber if the detected current has come to or fallen below said minimum threshold ion beam current.

3. A method according to claim 1, wherein the step of controlling the temperature of said source chamber is to compare the sensed temperature with a minimum threshold temperature, and then to stop cooling said source chamber if the sensed temperature has come to or fallen below said minimum threshold temperature.

4. A method of ion source generation, applied to an ion implanter, comprising:
    detecting the ion beam current of said ion implanter and comparing the ion beam current with a minimum threshold ion beam current;
    sensing the temperature of a source chamber of said ion implanter and comparing the sensed temperature with a minimum threshold temperature;
    cooling said source chamber of said ion implanter as the detected ion beam current has come to or has fallen below said minimum threshold ion beam current; and
    stopping cooling said source chamber as the sensed temperature has come to or fallen below said minimum threshold temperature.

5. A method according to claim 4, wherein the step of detecting the ion beam current of said ion implanter is to detect the current of a Faraday cup of said ion implanter.

6. A method according to claim 4, wherein the step of cooling said source chamber is to reduce a shell temperature of said source chamber.

7. A method according to claim 6, wherein the step of reducing said shell temperature is to use a fluid-circulating system.

8. A method according to claim 7, wherein said fluid-circulating system is a water-circulating system.

9. A method according to claim 4, wherein said minimum threshold ion beam current is predetermined or set to be a current value within a range from 90% to 95% of a maximum ion beam current.

10. A method according to claim 4, wherein said minimum threshold temperature is predetermined or set to be a temperature value at 90% to 95% of the maximum ion beam current.

11. A device of ion source generation combined with an ion implanter, comprising:
    an ion beam current detector connected to a Faraday cup of said ion implanter;
    a temperature sensor disposed on and contacted with the shell of a source chamber of said ion implanter;
    a cooling system disposed on and contacted with the shell of said source chamber; and
    a temperature controller electrically connected to said ion beam current detector, said temperature sensor and said cooling system, wherein said temperature controller adjusts the fluid flow rate of said cooling system according to the relationship of a temperature sensed by said temperature sensor and a current detected by said ion beam current detector.

12. A device according to claim 11, wherein said detected ion beam current is the current of said Faraday cup of said ion implanter.

13. A device according to claim 11, wherein said cooling system is a fluid-circulating system.

14. A device according to claim 13, wherein said fluid-circulating system is a water-circulating system.

15. A device according to claim 11, wherein said temperature controller starts up said cooling system or increases the fluid flow rate of said cooling system when said temperature controller determines said detected ion beam current has come to or fallen below a minimum threshold ion beam current in heating said source chamber.

16. A device according to claim 11, wherein said temperature controller shuts down said cooling system or reduces the fluid flow rate of said cooling system when said temperature controller determines said sensed temperature has come to or fallen below a minimum threshold temperature in cooling said source chamber.

* * * * *